United States Patent [19]
Goto

[11] Patent Number: 5,561,296
[45] Date of Patent: Oct. 1, 1996

[54] INFRARED DETECTOR HAVING MULTIPLE ELEMENT TYPE INFRARED SENSOR AND WIRING PATTERN FOR SIGNAL FETCHING

[75] Inventor: Junjiro Goto, Kawasaki, Japan

[73] Assignee: Fujitsu Limited, Kawasaki, Japan

[21] Appl. No.: 247,780

[22] Filed: May 23, 1994

Related U.S. Application Data

[63] Continuation of Ser. No. 920,678, Jul. 28, 1992, abandoned.

[30] Foreign Application Priority Data

Aug. 1, 1991 [JP] Japan ................................ 3-192847

[51] Int. Cl.⁶ ........................................ G01J 5/10
[52] U.S. Cl. ........................................ 250/352
[58] Field of Search ............................... 250/352

[56] References Cited

U.S. PATENT DOCUMENTS

| | | | |
|---|---|---|---|
| 4,005,288 | 1/1977 | Robillard | 250/352 |
| 4,487,037 | 12/1984 | Meignin et al. | 250/332 |
| 4,528,449 | 7/1985 | Gordon et al. | 250/352 |
| 4,719,353 | 1/1988 | Peck, Jr. et al. | 250/352 |
| 4,810,888 | 3/1989 | Boss | 250/352 |
| 4,954,708 | 9/1990 | Salzer et al. | 250/352 |

FOREIGN PATENT DOCUMENTS

| | | | |
|---|---|---|---|
| 44979 | 3/1980 | Japan | 250/352 |
| 33517 | 4/1981 | Japan | 250/352 |

*Primary Examiner*—Carolyn E. Fields
*Attorney, Agent, or Firm*—Armstrong, Westerman, Hattori, McLeland & Naughton

[57] ABSTRACT

An infrared detector includes an outer cylinder having an infrared permeable window and an inner cylinder accommodated in the outer cylinder. The inner cylinder has an end surface, a cylindrical side surface, and an annular tapering surface formed between the end surface and the cylindrical side surface. The annular tapering surface has a diameter continuously decreasing toward the end surface. A multiple element type infrared sensor is mounted on the end surface of the inner cylinder, the infrared sensor having a plurality of output electrodes. A cryogenic cooling arrangement is provided for cooling the infrared sensor to low temperatures, and a signal fetching arrangement is provided for carrying a signal detected by the infrared sensor, the signal fetching arrangement including wiring patterns formed on the end surface, the tapering surface and the cylindrical side surface of the inner cylinder. The tapering surface of the inner cylinder is mirror-finished, and the wiring patterns are formed by laser-cutting a gold thin film deposited on the inner cylinder.

3 Claims, 3 Drawing Sheets

INFRARED DETECTOR HAVING MULTIPLE ELEMENT TYPE INFRARED SENSOR AND WIRING PATTERN FOR SIGNAL FETCHING

This application is a continuation of application Ser. No. 07/920,678 filed Jul. 28, 1992, now abandoned.

BACKGROUND OF THE INVENTION

1. Field of the Invention

The present invention relates generally to a manufacturing method for an infrared detector, and more particularly to a method of forming a wiring pattern for signal fetching on an inner cylinder to be used in the infrared detector.

2. Description of the Related Art

An infrared sensor (photoelectric conversion element for detecting infrared radiation) constructed of a binary or ternary compound semiconductor is usually used in a cooled condition at low temperatures down to about liquid nitrogen temperature (77 K). Accordingly, in an infrared detector employing this kind of infrared sensor, an evacuated heat insulating container having a dual structure consisting of an inner cylinder and an outer cylinder is used. An infrared permeable window is provided at a part of the outer cylinder, and an infrared sensor is mounted on a wall of the inner cylinder opposed to the infrared permeable window. In operating the infrared detector having such a construction, a refrigerant such as liquid nitrogen is stored into the inner cylinder of the heat insulating container, or a Joule-Thomson type cryogenic cooling device or the like is inserted into the inner cylinder, thereby cooling the infrared sensor to a predetermined temperature.

In this kind of infrared detector, there is a case that a wiring pattern formed of a conductor is formed on the wall of the inner cylinder, and the infrared sensor is connected through the wiring pattern to an external circuit. Particularly in case of using a multiple element type infrared sensor, it is necessary to form many fine wiring patterns, so that a method of easily forming the wiring patterns is demanded.

A typical cooling type infrared detector in the prior art employs an evacuated heat insulating container having a dual structure consisting of an inner cylinder and an outer cylinder. In the heat insulating container, an infrared sensor is mounted on an end surface of the inner cylinder, and a wiring pattern for electrically connecting the infrared sensor to an external circuit is formed on the end surface and a cylindrical side surface of the inner cylinder.

According to this prior art structure, the infrared sensor is cooled to low temperatures by putting liquid nitrogen into the inner cylinder or inserting a Joule-Thomson type cooling device or the like into the inner cylinder. A constant bias current is let flow in the infrared sensor, and a change in resistance value of the multiple element type infrared sensor, which value changes with an incident intensity of infrared radiation, is fetched as a voltage signal to the external circuit, thereby displaying an infrared image on a monitor.

In the prior art infrared detector as mentioned above, the wiring pattern for connecting the infrared sensor to the external circuit need be formed on the end surface and the side surface of the inner cylinder. In general, this kind of wiring pattern is formed by first forming a metal thin film on the end surface and the side surface of the inner cylinder and then irradiating a laser beam to the inner cylinder to thereby vaporize off a part of the metal thin film. In this case, the pattern on the end surface must be continuous to the pattern on the side surface. Accordingly, position adjustment with a very high accuracy is needed between in irradiating the laser beam onto the end surface of the inner cylinder and in irradiating the laser beam onto the side surface of the inner cylinder. This position adjustment requires a troublesome work.

In the case that the irradiation of the laser beam onto the metal thin film formed on the end surface precedes the irradiation of the laser beam onto the metal thin film on the side surface, an irradiated position of the laser beam on the end surface cannot be easily acknowledged by image recognition from the side of the side surface in the step of irradiating the laser beam onto the metal thin film formed on the side surface. Accordingly, a position of irradiation of the laser beam on the side surface must be defined by numerical control or the like.

SUMMARY OF THE INVENTION

It is therefore an object of the present invention to provide a method of forming a wiring pattern on an inner cylinder to be suitably adopted in a cooling type infrared detector, in which the wiring pattern can be easily formed.

In accordance with an aspect of the present invention, there is provided a method of forming a wiring pattern on a cylinder having an end surface, a cylindrical side surface and an annular tapering surface formed between said end surface and said cylindrical side surface, said annular tapering surface having a diameter continuously decreasing toward said end surface, said method comprising the steps of forming a metal thin film on said end surface, said cylindrical side surface and said tapering surface; irradiating a laser beam to said cylinder in a direction substantially parallel to an axis of said cylinder to partially remove said metal thin film formed on said end surface and said tapering surface, thereby forming said wiring pattern on said end surface and said tapering surface; and irradiating said laser beam to said cylinder in a direction substantially perpendicular to said axis of said cylinder to partially remove said metal thin film formed on said cylindrical side surface, thereby forming said wiring pattern on said cylindrical side surface so that said wiring pattern on said cylindrical side surface continues to said wiring pattern on said tapering surface.

According to the present invention, the metal thin film formed on the end surface and the tapering surface of the cylinder is first partially removed by irradiating the laser beam to thereby form the wiring pattern on the end surface and the tapering surface. Then, the metal thin film formed on the side surface of the cylinder is partially removed by irradiating the laser beam to thereby form the wiring pattern on the side surface. At this time, since the wiring pattern previously formed on the tapering surface can be easily recognized by an image recognition technique, the formation of the wiring pattern on the side surface can be easily carried out.

In accordance with another aspect of the present invention, there is provided a method of forming a wiring pattern on a cylinder having an end surface, a cylindrical side surface and an annular tapering surface formed between said end surface and said cylindrical side surface, said annular tapering surface having a diameter continuously decreasing toward said end surface, said method comprising the steps of forming a metal thin film on said end surface, said cylindrical side surface and said tapering surface; irradiating a laser beam to said cylinder in a direction substantially perpendicular to an axis of said cylinder to partially remove said metal thin film formed on said cylindrical side surface and said tapering surface, thereby forming said wiring pattern on said cylindrical side surface and said tapering surface; and irradiating said laser beam to said cylinder in a direction substantially parallel to said axis of said cylinder to partially remove said metal thin film formed on said end side surface, thereby forming said wiring pattern on said end surface so that said wiring pattern on said end surface continues to said wiring pattern on said tapering surface.

In accordance with a further aspect of the present invention, there is provided an infrared detector comprising an outer cylinder having an infrared permeable window; an inner cylinder accommodated in said outer cylinder, said inner cylinder having an end surface, a cylindrical side surface, and an annular tapering surface formed between said end surface and said cylindrical side surface, said annular tapering surface having a diameter continuously decreasing toward said end surface; a multiple element type infrared sensor mounted on said end surface of said inner cylinder, said infrared sensor having a plurality of output electrodes corresponding to multiplicity of said element and having at least one common earth electrode; cryogenic cooling means for cooling said infrared sensor to low temperatures; and means for fetching a signal detected by said infrared sensor out of said outer cylinder, said signal fetching means including wiring patterns formed on said end surface, said tapering surface and said cylindrical side surface of said inner cylinder.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

There will now be described preferred embodiments of the present invention with reference to the drawings.

Figure 1:
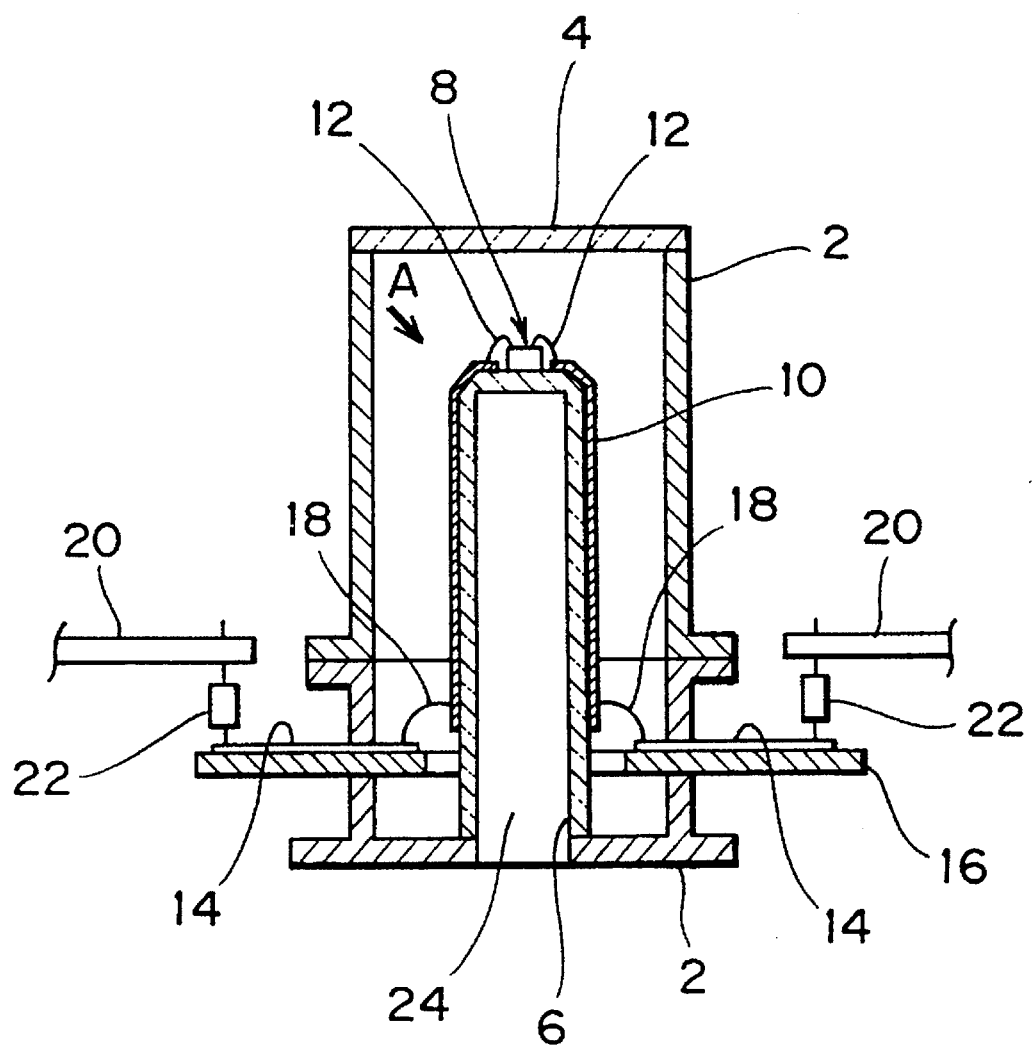
FIG. 1 is a schematic sectional view of an infrared detector according to a preferred embodiment of the present invention.
Figure 2:
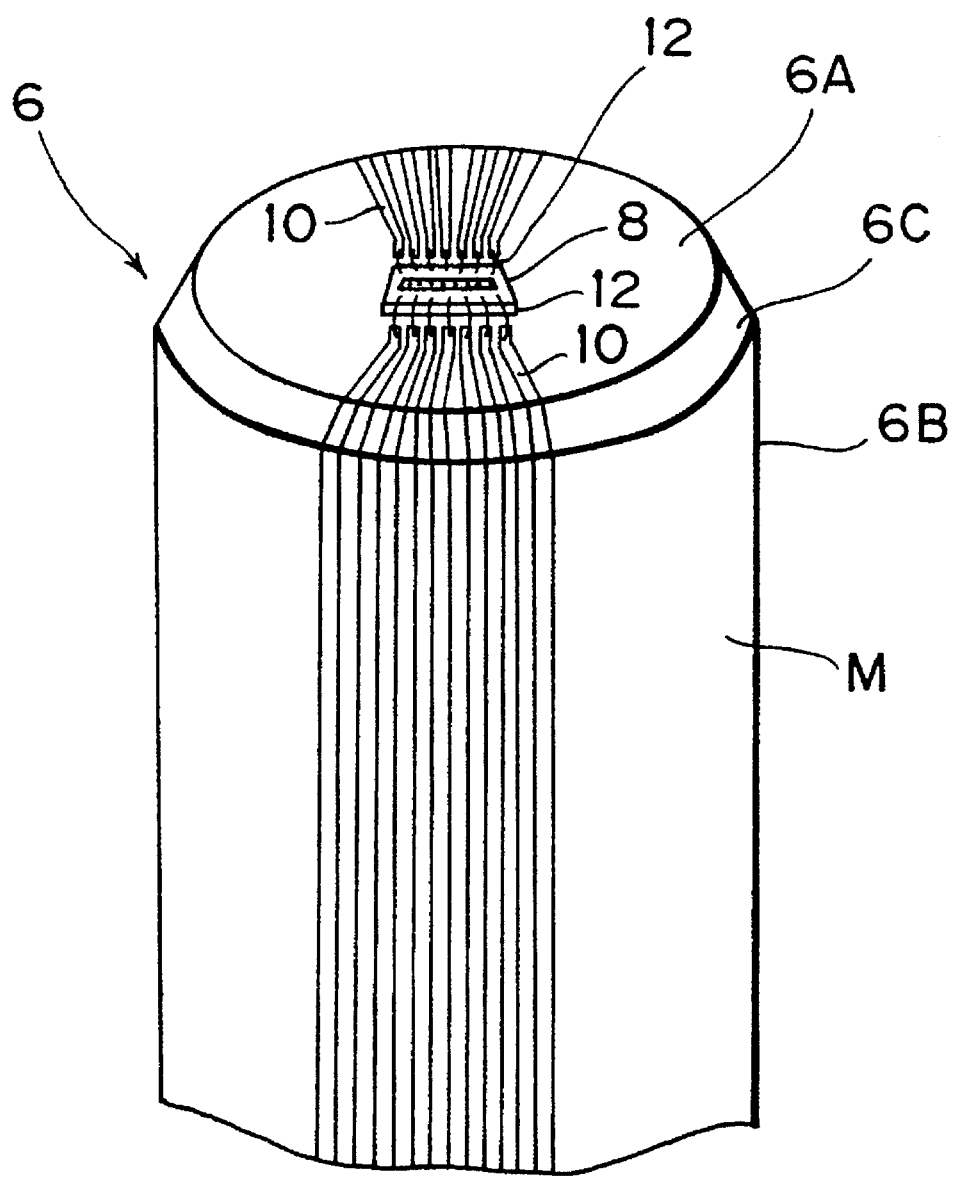
FIG. 2 is a perspective view of an upper end portion of an inner cylinder shown in FIG. 1.

FIG. 1 is a sectional view of an infrared detector according to a preferred embodiment of the present invention, and FIG. 2 is a perspective view of an upper end portion of an inner cylinder as viewed from a direction depicted by an arrow A in FIG. 1. The infrared detector includes an outer cylinder 2 made of Kovar (Fe-Ni-Co alloy), an infrared permeable window 4 made of germanium (Ge) or the like and sealedly mounted on an upper end of the outer cylinder 2, and an inner cylinder 6 made of glass or the like and sealedly mounted on a lower end of the outer cylinder 2 in such a manner as to be inserted into the outer cylinder 2 from the lower end thereof. Thus, there is defined a sealed space by the outer cylinder 2, the infrared permeable window 4 and the inner cylinder 6. The sealed space is evacuated.

Reference numeral 8 designates an infrared sensor of a multiple element type having a plurality (e.g., a hundred) of independent light receiving portions. The infrared sensor 8 is fixed on an end surface 6A (exposed to the evacuated space) of the inner cylinder 6 so as to be opposed to the infrared permeable window 4. The infrared sensor 8 is provided with a plurality of output electrodes and a common earth electrode. The number of the output electrodes corresponds to the number of the elements. An end portion of a side surface 6B of the inner cylinder 6 on the end surface 6A side is formed as an annular, frustoconical tapering surface 6C having a diameter continuously decreasing toward the end surface 6A.

A metal thin film M such as a gold (Au) thin film is formed by vapor deposition or the like on the end surface 6A, the side surface 6B and the tapering surface 6C of the inner cylinder 6. The metal thin film M is partially vaporized off by irradiating a laser beam thereto to form a plurality of wiring patterns 10 electrically insulated from one another. Each of the wiring patterns 10 is connected at one end thereof by bonding through a gold wire 12 to each corresponding output electrode of the infrared sensor 8.

An annular, flat ceramic terminal plate 16 is provided in the vicinity of the lower end of the outer cylinder 2 in such a manner as to cross the outer cylinder 2. A plurality of conductor patterns 14 made of gold or the like are formed on an upper surface of the ceramic terminal plate 16. Each of the conductor patterns 14 is connected at one end thereof through a gold wire 18 to the other end of each corresponding wiring pattern 10 formed on the side surface 6B of the inner cylinder 6. The other end of each conductor pattern 14 is connected through a resistor 22 to an external circuit formed on a printed wiring board 20, or directly connected by a lead wire (not shown) to the external circuit. A resistance value of the resistor 22 is adjusted so as to optimize a bias current to be let flow in each element in order to correct a variation in characteristics of each element.

In operating this infrared detector, liquid nitrogen or the like is put into a refrigerant storing portion 24 surrounded by the double cylinder, or a Joule-Thomson type cooling device or the like is inserted into the refrigerant storing portion 24, so as to cool the infrared sensor 8 to low temperatures, thereby converting an intensity of infrared radiation received into a voltage signal and outputting the voltage signal.

Now, a process of forming the wiring patterns 10 on the inner cylinder 6 will be described with reference to FIGS. 3A and 3B. First, the inner cylinder made of glass or the like is chamfered by mechanical polishing to form the tapering surface 6C. An area of the tapering surface 6C and an inclination thereof with respect to an axis of the inner cylinder 6 are set according to a depth of focus of the laser beam. When the depth of focus is 2 mm, for example, a thickness of a tapering portion forming the tapering surface 6C is set to a value smaller than 2 mm. Further, the tapering surface 6C is mirror-finished for the purpose of easiness of pattern recognition to be hereinafter described.

Then, the metal thin Film M such as Au or Au/Cr is Formed by vacuum deposition or the like on the end surface 6A, the side surface 6B and the tapering surface 6C of the inner cylinder 6. Then, the inner cylinder 6 is attached onto a work table (not shown) capable of controlling displacement of the inner cylinder 6 in biaxial directions on a plane perpendicular to the axis of the inner cylinder 6 so that the laser beam may be irradiated to the inner cylinder 6 in a direction substantially parallel to the axis of the inner cylinder 6.

Figure 3A:
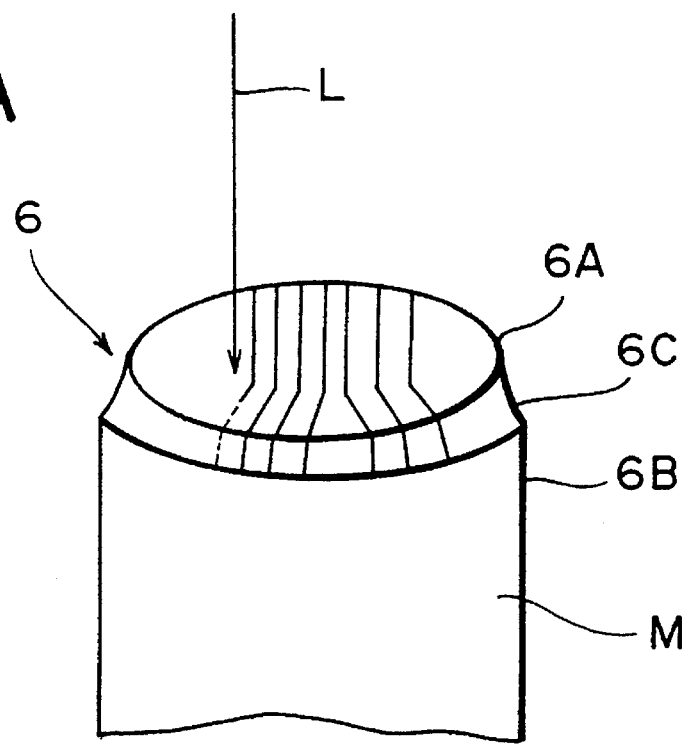
FIG. 3A is a schematic perspective view of the inner cylinder, illustrating a process of forming wiring patterns on an end surface and a tapering surface of the inner cylinder.

In this condition, the laser beam L is irradiated to the inner cylinder 6 in a direction substantially parallel to the axis of the inner cylinder 6 as shown in FIG. 3A, thereby partially removing the metal thin film M on the end surface 6A and the tapering surface 6C to form the wiring patterns on the end surface 6A and the tapering surface 6C. As the laser beam to be irradiated, YAG laser (wavelength: 1.06 μm) may be used. In a test, a laser trimming apparatus manufactured by Nippon Laser Kabushiki Kaisha was used. Since a depth of focus of the laser beam has an allowable range to some extent, an optical path length from a laser source to the inner cylinder 6 need not be adjusted, but good patterns can be formed on the tapering surfaces 6C.

Figure 3B:
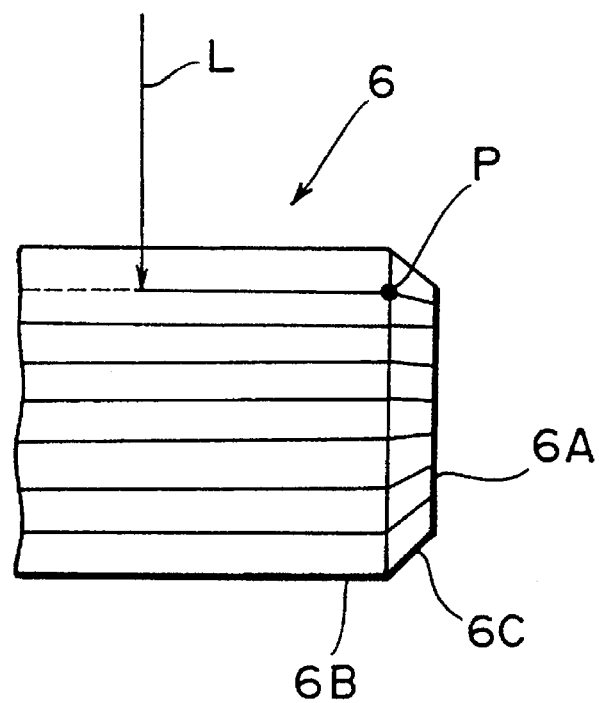
FIG. 3B is a schematic side view of the inner cylinder, illustrating a process of forming wiring patterns on a side surface of the inner cylinder after the process shown in FIG. 3A.

Then, as shown in FIG. 3B, the inner cylinder 6 is rotated by 90° with the laser beam system remaining still, and the laser beam is irradiated to the inner cylinder 6 in a direction substantially perpendicular to the axis of the inner cylinder 6. At this time, the inner cylinder 6 is fixed on another work table (not shown) capable of controlling rotation of the inner cylinder 6 about the axis thereof and displacement of the inner cylinder 6 along the axis thereof. A starting point P of irradiation of the laser beam L onto the side surface 6B of the inner cylinder 6 can be easily acknowledged by pattern recognition of the wiring patterns having been already formed on the tapering surface 6C from the direction of irradiation of the laser beam L.

In the conventional method, no tapering surface is formed on the inner cylinder. Therefore, it is necessary to use a three-dimensional laser beam machine which is complicated in construction and highly accurate, so as to form the continuous wiring patterns on the end surface and the side surface of the inner cylinder. To the contrary, according to the preferred embodiment, the wiring patterns on the tapering surface 6C can be easily recognized in the step illustrated in FIG. 3B, so that it is sufficient to use a two-dimensional laser beam machine, and a high positioning accuracy is not required.

Although the formation of the wiring patterns on the end surface 6A and the tapering surface 6C of the inner cylinder 6 precedes the formation of the wiring patterns on the side surface 6B of the inner cylinder 6 in the above preferred embodiment, the process illustrated in FIG. 3A and the process illustrated in FIG. 3B may be reversed in order. That is, the formation of the wiring patterns on the side surface 6B and the tapering surface 6C may precede the formation of the wiring patterns on the end surface 6A. Further, although the tapering surface 6C is formed as a part of a conical surface in the above preferred embodiment, it may be formed as a part of a spherical surface.

What is claimed is:

1. An infrared detector, comprising:
    an outer cylinder having an infrared permeable window;
    an inner cylinder accommodated in said outer cylinder, said cylinder having an end surface, a cylindrical side surface, and an annular tapering surface formed between said end surface and said cylindrical side surface, said annular tapering surface having a diameter continuously decreasing at a substantially linear rate toward said end surface;
    a multiple element type infrared sensor mounted on said end surface of said inner cylinder, said infrared sensor having a plurality of output electrodes corresponding to the multiple elements of said multiple element type infrared sensor and having at least one common ground electrode;
    cryogenic cooling means for cooling said infrared sensor to low temperatures;
    means for fetching a signal detected by said infrared sensor out of said outer cylinder, said signal fetching means including a plurality of wiring patterns formed on said end surface, said tapering surface and said cylindrical side surface of said inner cylinder, said wiring patterns facing said outer cylinder, each of said wiring patterns being connected at one end thereof to each corresponding one of said output electrodes of said infrared sensor, said wiring patterns being formed by laser cutting a thin metal film deposited on said end surface, said tapering surface and said cylindrical side surface of said inner cylinder; and
    said annular tapering surface having a first radius at a boundary of said tapering surface and said cylindrical side surface and a second radius at a boundary of said tapering surface and said end surface, a difference between said first radius and said second radius being smaller than a depth of focus of a laser beam irradiated on said tapering surface.

2. The infrared detector according to claim 1, wherein said tapering surface of said inner cylinder has a mirror-finished surface, and said wiring patterns are composed of a gold film disposed on said inner cylinder.

3. An infrared detector, comprising:
    an outer cylinder having an infrared permeable window;
    an inner cylinder accommodated in said outer cylinder, said inner cylinder having an end surface, a cylindrical side surface, and an annular tapering surface formed between said end surface and said cylindrical side surface, said annular tapering surface having a diameter continuously decreasing at a substantially linear rate toward said end surface;
    a multiple element type infrared sensor mounted on said end surface of said inner cylinder, said infrared sensor having a plurality of output electrodes corresponding to the multiple elements of said multiple element type infrared sensor and having at least one common ground electrode;
    cryogenic cooling means for cooling said infrared sensor to low temperatures;
    means for fetching a signal detected by said infrared sensor out of said outer cylinder, said signal fetching means including a plurality of wiring patterns formed on said end surface, said tapering surface and said cylindrical side surface of said inner cylinder, said wiring patterns facing said outer cylinder; and means for connecting each of said output electrodes of said infrared sensor with corresponding one of said wiring patterns on said end surface of said inner cylinder, said wiring patterns being formed by laser cutting a thin metal film deposited on said end surface, said tapering surface and said cylindrical side surface of said inner cylinder; and
    said annular tapering surface having a first radius at a boundary of said tapering surface and said cylindrical side surface and a second radius at a boundary of said tapering surface and said end surface, a difference between said first radius and said second radius being smaller than a depth of focus of a laser beam irradiated on said tapering surface.

* * * * *